(12) United States Patent
Tan

(10) Patent No.: US 7,035,087 B2
(45) Date of Patent: Apr. 25, 2006

(54) ELECTRONIC APPARATUS WITH A HOUSING FOR SEEING INSIDE

(75) Inventor: Ko-Chen Tan, Taipei Hsien (TW)

(73) Assignee: Micro-Star Int'l Co., Ltd., Taipei Hsien (TW)

( * ) Notice: Subject to any disclaimer, the term of this patent is extended or adjusted under 35 U.S.C. 154(b) by 247 days.

(21) Appl. No.: 10/604,789

(22) Filed: Aug. 17, 2003

(65) Prior Publication Data

US 2005/0036279 A1 Feb. 17, 2005

(51) Int. Cl.
*G06F 1/16* (2006.01)
(52) U.S. Cl. ............... 361/679; 361/683; 361/816; 361/818; 174/35 R; 174/35 MS; 312/223.2
(58) Field of Classification Search ................ 361/679, 361/683, 801–818; 174/35 MS, 35 R; 428/209, 428/457; 312/223.2, 223.3, 257, 236, 223.1, 312/223.6, 263, 296; 55/385.11, 385.6, 481, 55/485

See application file for complete search history.

(56) References Cited

U.S. PATENT DOCUMENTS

| | | | | |
|---|---|---|---|---|
| 4,381,421 A | * | 4/1983 | Coats et al. | 174/35 R |
| 4,643,785 A | * | 2/1987 | Paynton | 156/101 |
| 5,208,425 A | * | 5/1993 | Hasegawa et al. | 174/35 R |
| 5,505,533 A | * | 4/1996 | Kammersqard et al. | 312/236 |
| 6,054,647 A | * | 4/2000 | Ridener | 174/35 MS |
| 6,474,410 B1 | * | 11/2002 | Minich et al. | 165/104.33 |
| 6,589,308 B1 | * | 7/2003 | Gianelo | 55/385.6 |
| 6,855,883 B1 | * | 2/2005 | Matsui | 174/35 MS |
| 2002/0174994 A1 | * | 11/2002 | Wu | 174/35 R |
| 2003/0164243 A1 | * | 9/2003 | Arakawa et al. | 174/35 MS |
| 2005/0039936 A1 | * | 2/2005 | Hikita et al. | 174/35 R |

FOREIGN PATENT DOCUMENTS

| | | |
|---|---|---|
| CN | 2484586 Y | 4/2002 |
| CN | 2497354 Y | 6/2002 |
| DE | 878076 | 6/1953 |
| DE | 1925259 | 6/1971 |
| DE | 3545790 | 7/1986 |
| DE | 3630426 | 3/1988 |
| DE | 4221066 | 1/1993 |
| DE | 29813396 | 11/1998 |
| DE | 10050326 | 5/2002 |
| JP | 361225013 A1 | * 10/1986 |
| JP | 410041679 A | * 2/1998 |
| JP | 410099510 A | * 4/1998 |

* cited by examiner

*Primary Examiner*—Michael Datskovskiy
(74) *Attorney, Agent, or Firm*—Winston Hsu

(57) ABSTRACT

An electronic apparatus includes a housing comprising a plurality of holes on a first side wall, a transparent dust-proof member installed on a side of the first side wall having the plurality of holes, a motherboard may be installed on a second side wall inside the housing having a processor installed on the motherboard inside the housing for processing programs and data and a memory for storing programs and data. The transparent member allows visual inspection of the interior of the housing. The plurality of holes provides electromagnetic shielding.

15 Claims, 7 Drawing Sheets

| Frequency | Without metal net (dBuv) | With metal net (dBuv) | Shielding effect (dBuv) |
|---|---|---|---|
| 101 | -9.01 | -20.52 | 11.51 |
| 126 | -5.66 | -17.13 | 11.47 |
| 133 | -4.74 | -18.30 | 13.56 |
| 168 | -0.31 | -10.63 | 10.32 |
| 176 | -2.08 | -20.57 | 18.49 |
| 184 | -1.04 | -22.48 | 21.44 |
| 200 | -8.59 | -22.87 | 16.28 |
| 226 | -0.91 | -17.90 | 16.99 |
| 258 | -1.19 | -21.30 | 20.11 |
| 268 | -1.20 | -20.70 | 19.50 |
| 329 | -5.76 | -28.67 | 22.91 |
| 379 | -3.41 | -22.87 | 19.46 |
| 400 | -2.82 | -21.48 | 18.66 |
| 430 | -6.01 | -24.08 | 18.07 |
| 560 | -6.38 | -21.47 | 15.09 |
| 593 | -0.81 | -14.75 | 13.94 |
| 638 | 1.06 | -11.30 | 12.36 |
| 649 | -4.24 | -20.29 | 16.05 |
| 668 | 3.50 | -11.35 | 14.85 |
| 743 | 2.91 | -12.48 | 15.39 |
| 819 | -6.67 | -19.14 | 12.47 |
| 864 | -5.50 | -18.93 | 13.43 |
| 894 | -2.88 | -11.52 | 8.84 |
| 927 | -4.86 | -11.27 | 6.41 |
| 969 | -8.03 | -13.93 | 7.90 |

Fig. 6

ELECTRONIC APPARATUS WITH A HOUSING FOR SEEING INSIDE

BACKGROUND OF INVENTION

1. Field of the Invention

The present invention relates to an electronic apparatus, and more specifically, to an electronic apparatus with a housing for seeing inside.

2. Description of the Prior Art

An electronic apparatus comprises modules such as a central processing unit (CPU), a memory, an interface card, a hard disk drive, and a power supply. These modules are contained in a housing and communicate mutually via numerous electrical connections. The electronic signals of these modules and electrical connections have a high frequency, for instance, the frequency of a CPU is up to 1 GHz, thus electromagnetic radiation occurs. Electromagnetic radiation has an unfavorable influence on users and the environment, i.e. electromagnetic radiation interference, so that most countries and regions have set up standards for electromagnetic radiation. In order to prevent electromagnetic radiation, a typical computer housing is made of metal.

Additionally, as the speed of data processing in computers improved, the inner structure of the electronic apparatus becomes more and more complicated. An electronic apparatus may fail to properly function simply due to defect or malfunction of only one part. If the user can find the reason as soon as possible, down time and cost waste can be conserved. For instance, if a heat radiating fan or a water-cooling system breaks down so that the electronic apparatus cannot operate, it is difficult to discover because the conventional electronic apparatus is covered with a metal housing. Therefore, if the user can find the reason of malfunction from outside of the electronic apparatus, time wasted by inspection can be reduced.

In U.S. Pat. No. 5,808,237 "Electronics case for reducing electromagnetic radiation", Hancock et al., and U.S. Pat. No. 6,002,586 "Apparatus for adjustable mounting a cooling device to a computer enclosure", Chen et al., computer housings with a plurality of holes for heat radiation are disclosed. However, the plurality of holes has no corresponding protection so that it is unable to keep dust from entering into the housing. Moreover, the light entering into the housing via the holes is horizontal to a motherboard, so that it is not easy to see inside the housing.

SUMMARY OF INVENTION

It is therefore a primary objective of the present invention to provide an electronic apparatus to solve the problems mentioned above.

Briefly summarized, an electronic apparatus includes a housing comprising a plurality of holes on a first side board, a transparent dust-proof member installed on a side of the plurality of holes, a motherboard installed on a second side board inside the housing, a processor installed on the motherboard inside the housing for processing programs and data, and a memory installed on the motherboard inside the housing for storing programs and data.

It is an advantage of the present invention that a user can see inside the electronic apparatus, and dust is kept from entering into the electronic apparatus.

It is another advantage of the present invention that, compared to conventional housings made of metal, the housing according to the present invention is lighter in weight.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 6 is a table of contrast of electromagnetic shielding effect in different frequencies of the electronic apparatus with metal net or without metal net.

DETAILED DESCRIPTION

Figure 1:
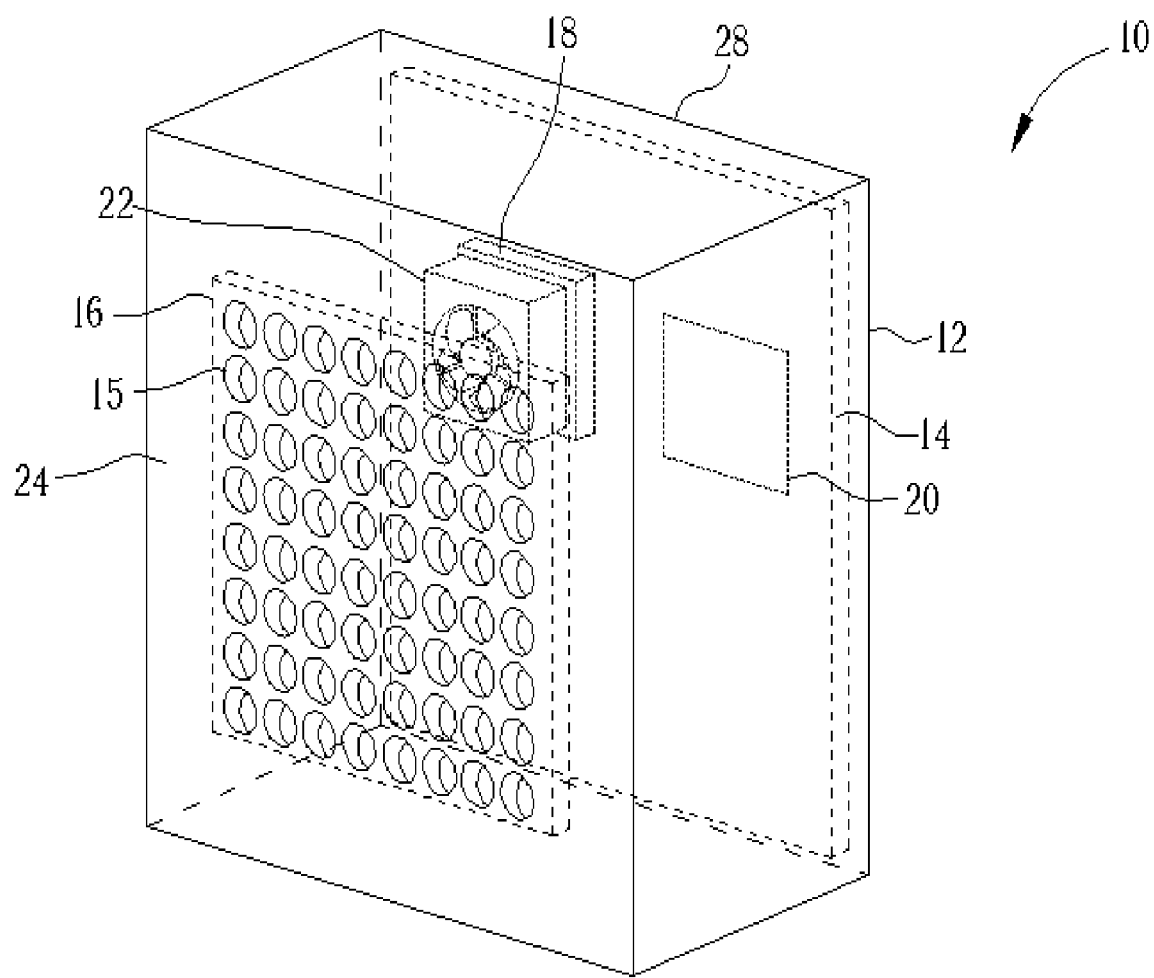
FIG. 1 illustrates a perspective view of an electronic apparatus according to the present invention.
Figure 2:
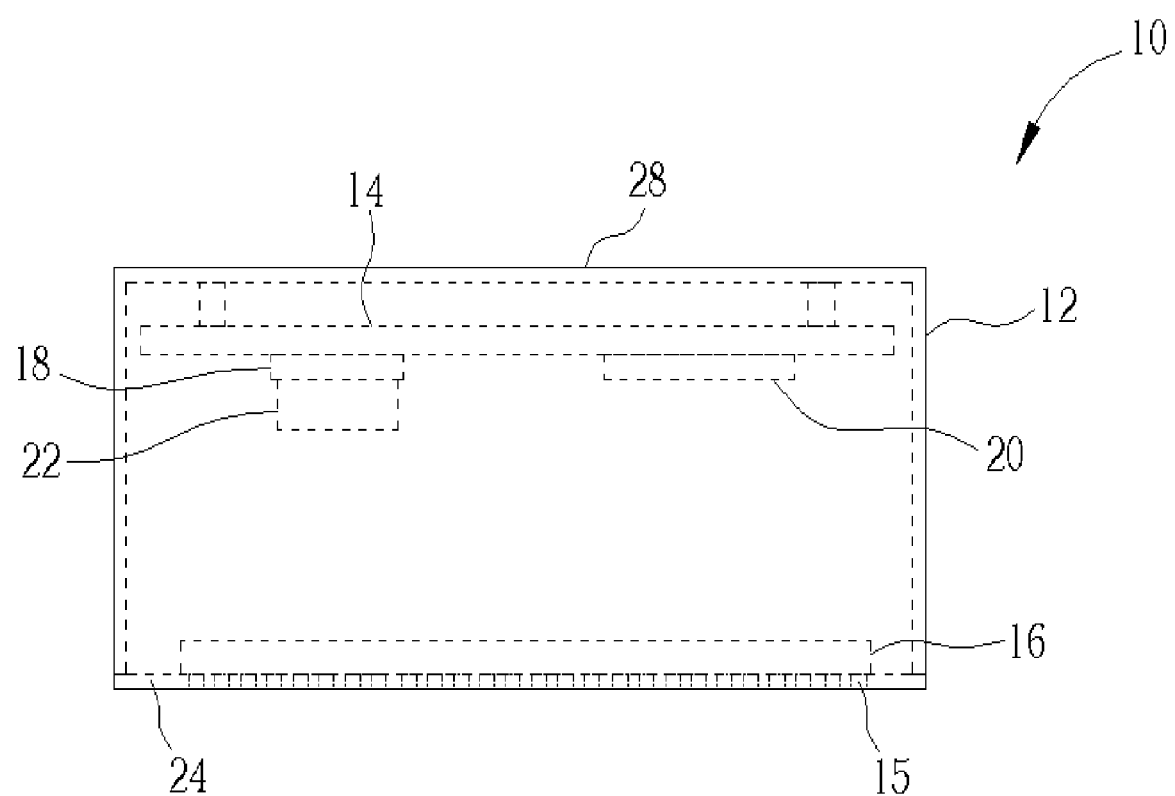
FIG. 2 illustrates a perspective top view of the electronic apparatus of FIG. 1.

Please refer to FIG. 1 showing a perspective view of an electronic apparatus 10 according to the first embodiment of the present invention, and FIG. 2 showing a perspective top view of the electronic apparatus 10. The electronic apparatus 10 includes a housing 12, the housing 12 has a plurality of holes 15 on a first side wall 24. A motherboard 14 and a transparent dust-proof member 16 are installed in the electronic apparatus 10. The motherboard 14 is installed on a second side wall 28, and the transparent dust-proof member 16 is installed parallel to the first side wall having the plurality of holes 15. A processor 18 for processing programs and data and a memory 20 for storing programs and data are installed on the motherboard 14. A fan 22 is installed above the processor 18 for heat radiation. The first side wall 24 and the second side wall 28 are not adjacent to each other. In FIG. 1, the transparent dust-proof member 16 is installed inside of the first side wall having the plurality of holes 15, however, it can be also installed outside of the first side wall having the plurality of holes 15.

The electronic apparatus 10 is a very complicated product, any problem of any part may interrupt the operation of the electronic apparatus 10. Faulty operation can be due to any of a variety of reasons, including hardware or software problems, or even because the fan 22 or a bus line inadvertently becomes loose. Therefore, when problems of the electronic apparatus 10 occur, since the holes 15 on the first side wall 24 correspond to the motherboard 14 on the second side wall 14, the user can look inside the electronic apparatus 10 through the holes 15. For instance, if the electronic apparatus 10 is down, the user can know the condition of the fan 22 or the bus line by looking inside through the holes 15 on the housing 12. Only when the fan 22 stops or the bus line is loosened, the user should shut down the electronic apparatus 10 and remove the housing 12 for further repairing, if no visible hardware problems have occurred, the problem may be in software so that time is not wasted opening the housing 12. Additionally, the transparent dust-proof member 16 is installed inside or outside the first side wall 24 of the housing 12. The transparent dust-proof member 16 may be installed either against the holes 15 separated from the holes by a predetermined distance by adhering to the housing l2. The transparent dust-proof member 16 is made of glass or plastic to prevent dust from entering into the electronic apparatus 10 and interrupting its operation.

Figure 3:
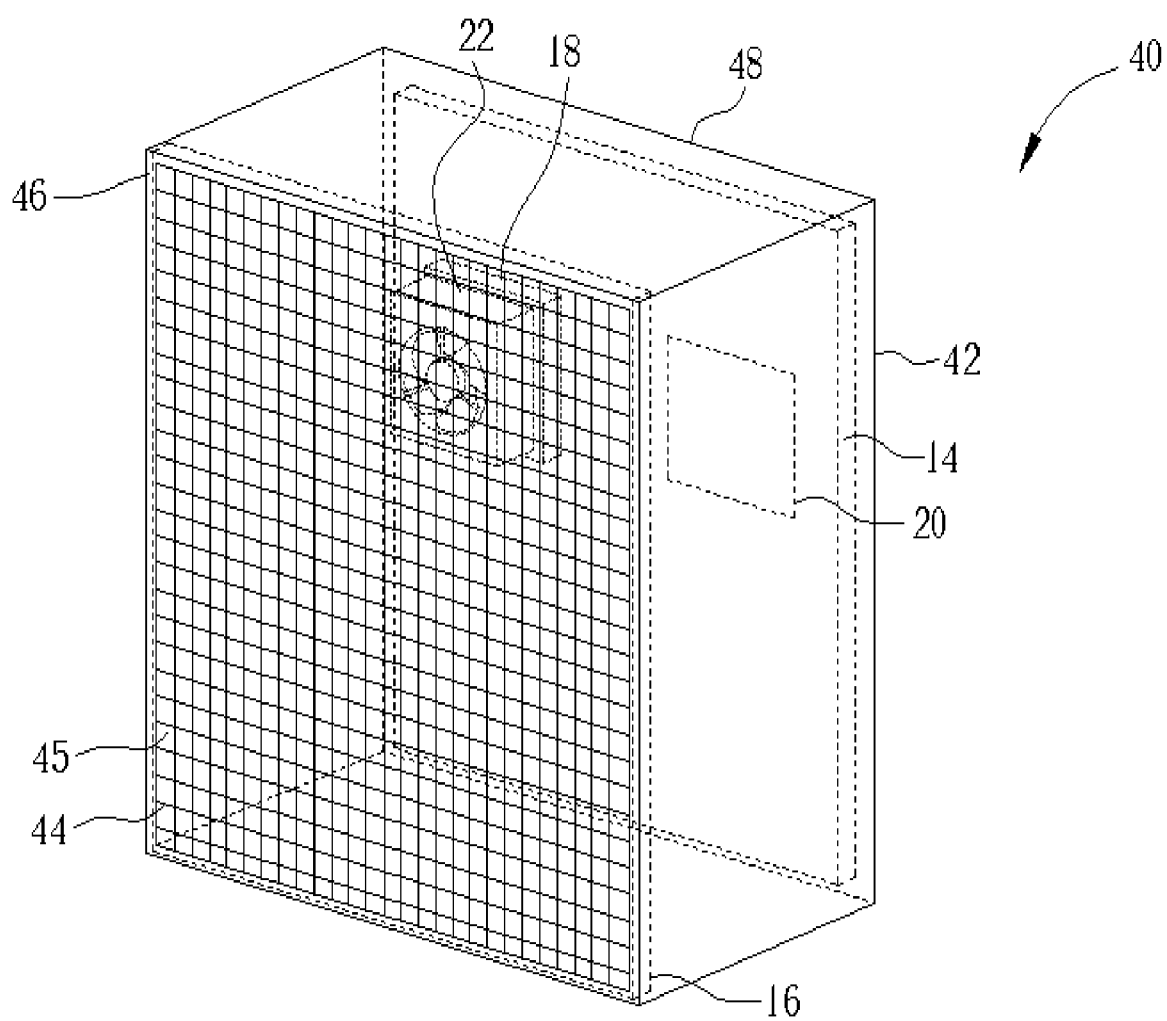
FIG. 3 illustrates a perspective front view of another electronic apparatus according to the present invention.

Please refer to FIG. 3 showing a perspective front view of an electronic apparatus 40 according to a second embodiment of the present invention. The devices of the electronic apparatus 40 in FIG. 3 having the same numberings have the same name and function as those of the electronic apparatus 10 in FIG. 1, so that a further description is hereby omitted. The difference between the electronic apparatus 40 and the electronic apparatus 10 is that, the first side wall 24 with the holes 15 of the electronic apparatus 10 is replaced by a first side wall 46 with a metal net 44. A motherboard 14 may be installed on a second side wall 48, and the metal net 44 is required to contact to a housing 42 as well as the strings of the metal net 44 are required to contact each other in order to form a ground circuit to shield the electromagnetic wave generated by the electronic apparatus 40. The metal net 44 may be separated from the housing 42 or may adhere to the housing 42, while a transparent dust-proof member 16 can be installed on either side of the metal net 44 adhering to the housing 42, may be separated from the housing 42, or even comprise the metal net 44.

Figure 4:
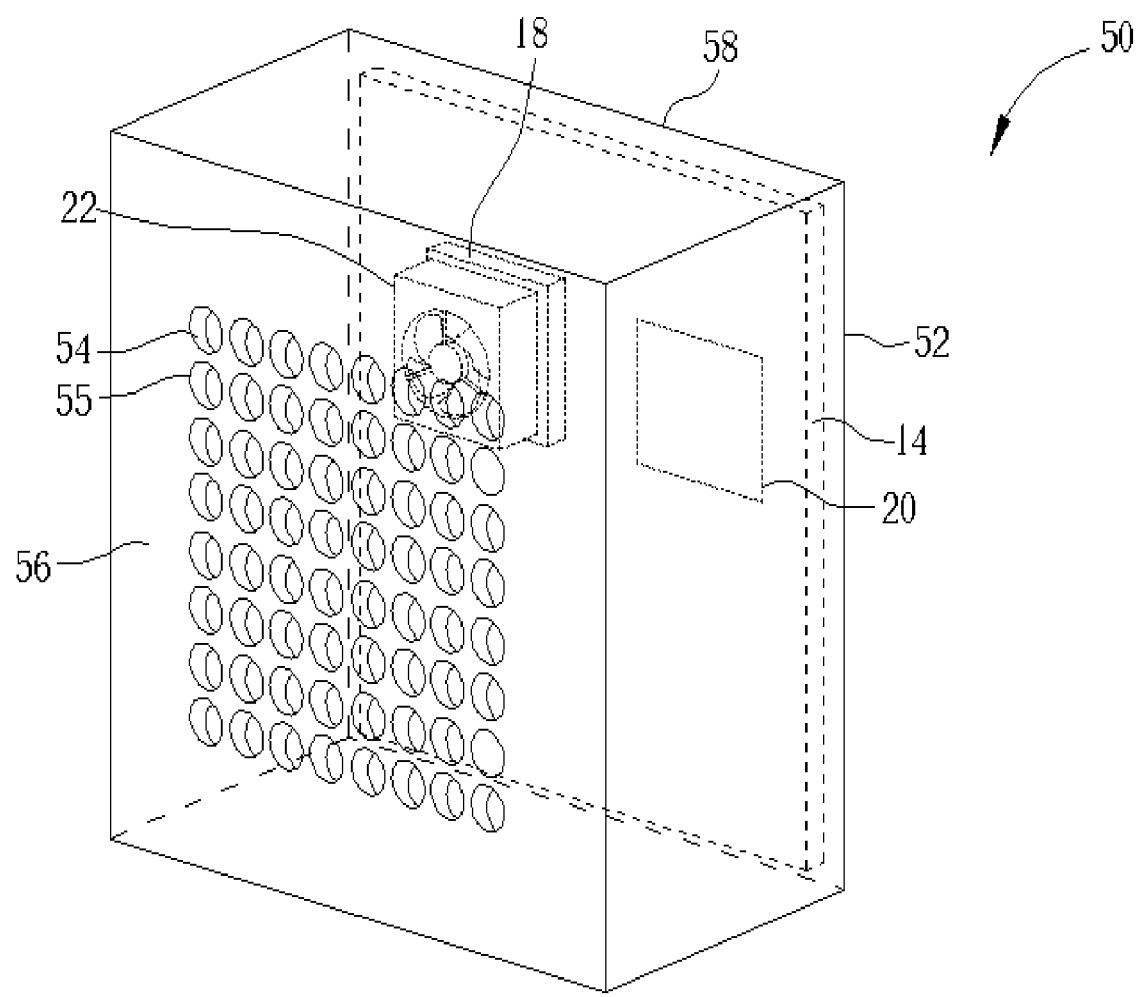
FIG. 4 illustrates a perspective view of another electronic apparatus according to the present invention.

Please refer to FIG. 4 showing a perspective view of an electronic apparatus 50 according to a third embodiment of the present invention. The devices of the electronic apparatus 50 in FIG. 4 having the same numberings have the same name and function as those of the electronic apparatus 10 in FIG. 1, so that a further description is hereby omitted. The difference between the electronic apparatus 50 and the electronic apparatus 10 is that, the electronic apparatus 50 includes a housing 52, a motherboard 14 may be installed on a second side wall 58, a first side wall 56 includes a plurality of holes 55, but a transparent dust-proof member 54 is installed in the holes 55. The transparent dust-proof member 54 is made of glass or plastic, which can be inserted in the holes 55 or separated from the holes 55 by a predetermined distance by adhering to the housing 52.

Figure 5:
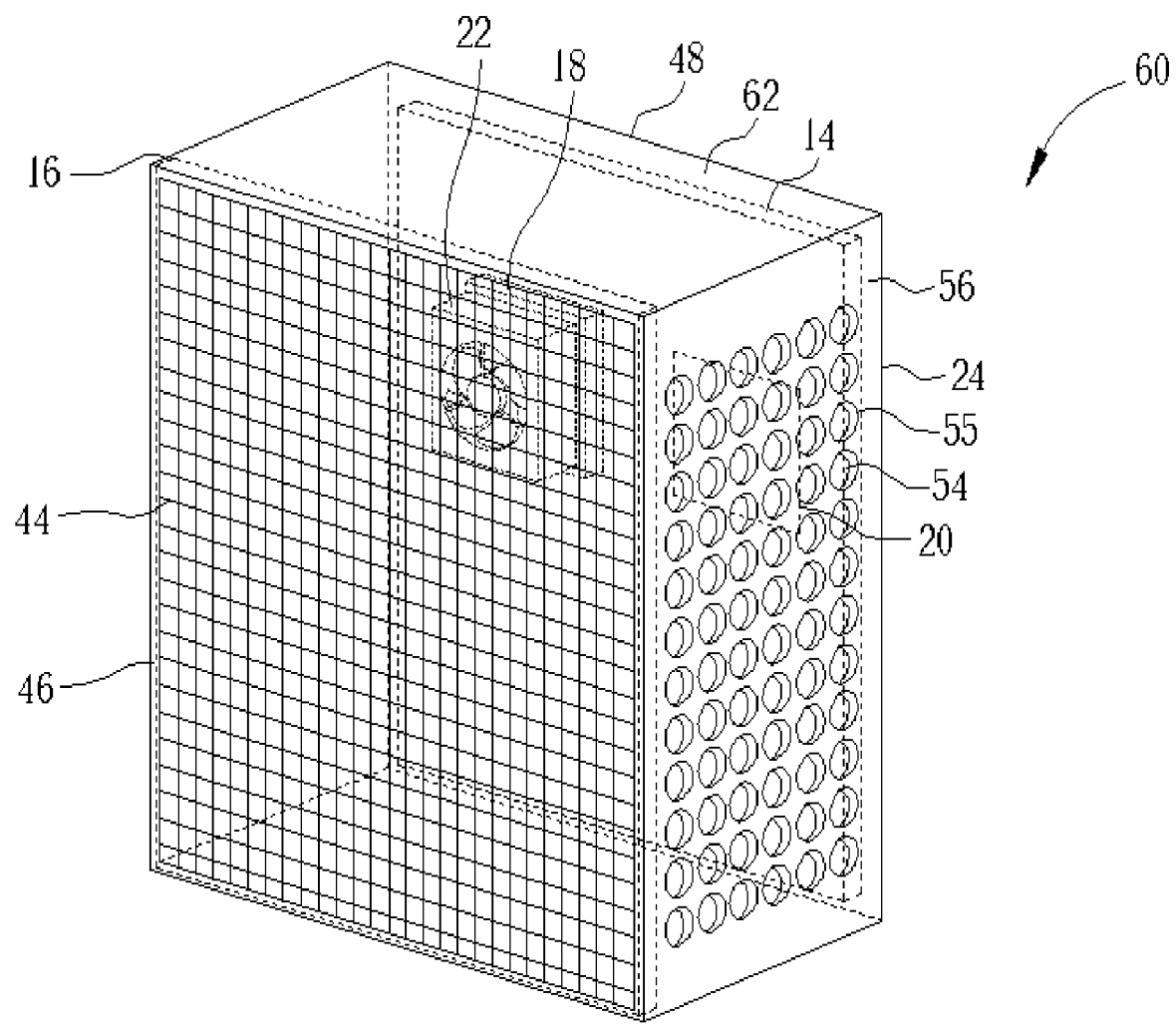
FIG. 5 illustrates another electronic apparatus according to the present invention.

Please refer to FIG. 5 showing an electronic apparatus 60 according to a fourth embodiment of the present invention. Being different from FIG. 3 and FIG. 4, the electronic apparatus 60 combines the side wall 46 in FIG. 3 and the side wall 56 in FIG. 4. In other words, a housing 62 includes side walls with holes on two different side walls. As shown, a side wall 46 with a metal net and a side wall 56 with holes may both be applied to the housing 62 of the present invention.

Figure 7:
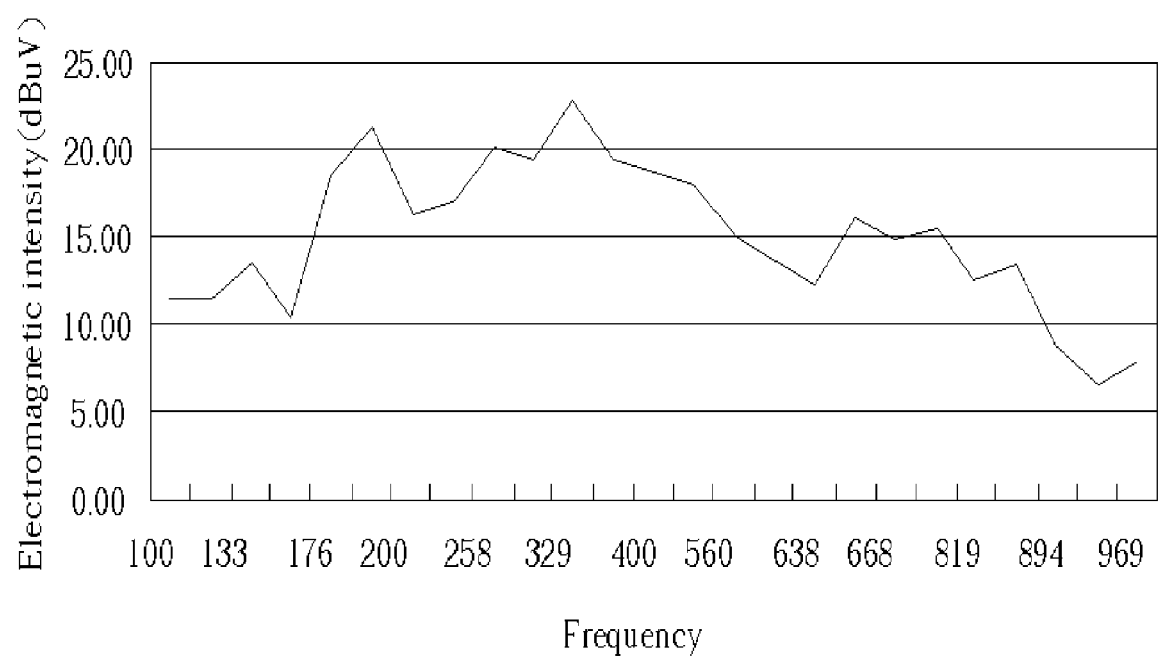
FIG. 7 is a curve chart of the table in FIG. 6.

Please refer to FIG. 6 showing the contrast of electromagnetic shielding effects for different frequencies of the electronic apparatus 40 with the metal net 44 or without metal net 44, and to FIG. 7 showing a curve chart according to FIG. 6, where the horizontal axis represents frequency and the vertical axis represents the electromagnetic intensity under a condition shielded by the metal net 44. As shown in FIG. 6 and FIG. 7, while detecting the electromagnetic intensity in different frequencies of the electronic apparatus 40 with metal net 44, it is obvious that the electromagnetic intensity below 250 MHz is less than 35 db, the electromagnetic intensity between 250 MHz and 1000 MHz is less than 42 db, which means that the electronic apparatus 40 with metal net 44 has a shielding effect agreeing with industrial standards toward electromagnetic inteference. Therefore, the electronic apparatus according to the present invention is capable of shielding electromagnetic waves.

In addition to electronic apparatuses, the present invention can be applied on other corresponding electronic products, such as personal digital assistants (PDAs), servers, mobile phones, etc. Housings with the features disclosed by the present invention belong to the range of the present invention.

In contrast to the prior art, the electronic apparatus according to the present invention has a housing with a plurality of holes allowing visible inspection of the inner parts of the electronic apparatus. The present invention cannot only reduce the time spent inspecting the electronic apparatus when problems occur, but can also prevent dust from entering the electronic apparatus to interrupt its operation and prevent emergence of electromagnetic radiation from within the housing.

What is claimed is:

1. An electronic apparatus comprising:
    a housing comprising a plurality of holes on a first side wall;
    a transparent dust-proof member installed approximately parallel to the first side wall;
    a motherboard installed on a second side wall inside the housing;
    a processor installed on the motherboard inside the housing for processing programs and data; and
    a memory installed on the motherboard inside the housing for storing programs and data.

2. The electronic apparatus of claim 1 wherein the transparent dust-proof member is installed inside the housing.

3. The electronic apparatus of claim 1 wherein the transparent dust-proof member is installed outside the housing.

4. The electronic apparatus of claim 1 wherein the transparent dust-proof member includes glass materials.

5. The electronic apparatus of claim 1 wherein the transparent dust-proof member includes plastic materials.

6. The electronic apparatus of claim 1 wherein the transparent dust-proof member is installed on a side of the plurality of holes and adheres to the housing.

7. The electronic apparatus of claim 1 wherein the transparent dust-proof member is installed on a side of the plurality of holes.

8. The electronic apparatus of claim 1 wherein the first side wall is not neighboring to the second side wall.

9. An electronic apparatus comprising:
    a housing comprising a plurality of holes on a first side wall;
    a transparent dust-proof member inserted inside the plurality of holes;
    a motherboard installed on a second side wall inside the housing;
    a processor installed on the motherboard inside the housing for processing programs and data; and
    a memory installed on the motherboard inside the housing for storing programs and data.

10. The electronic apparatus of claim 9 wherein the transparent dust-proof member includes glass materials.

11. The electronic apparatus of claim 9 wherein the transparent dust-proof member includes plastic materials.

12. The electronic apparatus of claim 9 wherein the transparent dust-proof member is inserted in the plurality of holes and adheres to the housing.

13. The electronic apparatus of claim 9 wherein the transparent dust-proof member is inserted in the plurality of holes.

14. The electronic apparatus of claim 9 wherein the first side wall is not neighboring to the second side wall.

15. A housing for a computer, the housing comprising:
    a first side wall for mounting electromagnetic radiation producing circuitry;

a second side wall comprising a metal net of a fineness capable of substantially preventing electromagnetic radiation generated by the circuitry from passing through the second side wall in quantities greater than a predetermined limit, a plurality of holes formed by metal in the metal net for providing visual access to the interior of the housing; and a substantially transparent dustproof member installed approximately parallel to the metal net such that dust is prevented from passing through the plurality of holes into the interior of the housing.

* * * * *